US012627120B2

(12) United States Patent
Pilato

(10) Patent No.: US 12,627,120 B2
(45) Date of Patent: May 12, 2026

(54) ELECTRICAL PANEL WITH VENTING AND WATER PROTECTION

(71) Applicant: Leviton Manufacturing Co., Inc., Melville, NY (US)

(72) Inventor: Nicholas Pilato, Forest Hills, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 204 days.

(21) Appl. No.: 18/427,133

(22) Filed: Jan. 30, 2024

(65) Prior Publication Data

US 2025/0246880 A1      Jul. 31, 2025

(51) Int. Cl.
H02B 1/28 (2006.01)
H02B 1/56 (2006.01)
H05K 7/20 (2006.01)

(52) U.S. Cl.
CPC ................. H02B 1/28 (2013.01); H02B 1/56 (2013.01); H05K 7/20 (2013.01)

(58) Field of Classification Search
None
See application file for complete search history.

(56) References Cited

U.S. PATENT DOCUMENTS

| | | | |
|---|---|---|---|
| 10,819,088 B2 | 10/2020 | Janish et al. | |
| 11,980,006 B2 * | 5/2024 | Gao ................... | H05K 7/20254 |
| 2010/0118488 A1 * | 5/2010 | Hoffman ............ | H05K 7/20909 |
| | | | 363/141 |
| 2011/0313576 A1 * | 12/2011 | Nicewonger ...... | H05K 7/20781 |
| | | | 361/701 |
| 2015/0011151 A1 * | 1/2015 | San Clemente ....... | A47B 31/00 |
| | | | 454/184 |
| 2021/0320466 A1 * | 10/2021 | Broere ..................... | H02G 3/14 |
| 2023/0067321 A1 * | 3/2023 | Gao ................... | H05K 7/20272 |
| 2024/0206135 A1 * | 6/2024 | Kosteva ............... | H02M 7/003 |

* cited by examiner

*Primary Examiner* — Courtney L Smith
(74) *Attorney, Agent, or Firm* — KDW Firm PLLC

(57)      ABSTRACT

An electrical panel including a water management system for redirecting water away from any sensitive electrical components and out of the panel. In some embodiments, the electrical panel includes an enclosure including an opening formed in a top surface thereof to enable air to move into and out of the enclosure. The electrical panel further includes a drip lip for directing any water that enters the opening out of the enclosure, the drip lip including a drip tray arranged and configured to receive any water entering through the opening and a channel arranged and configured to receive the water from the drip tray and to direct the water out of the enclosure.

19 Claims, 12 Drawing Sheets

170

172

170

172

ELECTRICAL PANEL WITH VENTING AND WATER PROTECTION

FIELD OF THE DISCLOSURE

The present disclosure relates generally to electrical panels such as, for example, circuit breaker panels or the like, and more particularly to systems and methods for enabling venting of the electrical panel while managing water migration.

BACKGROUND OF THE DISCLOSURE

Electrical panels such as, for example, circuit breaker panels, relay panels, or the like (terms used interchangeably herein without the intent to limit or distinguish), are well known. In a conventional power distribution system, power from a utility may be fed to an electrical panel which, in turn, may feed a series of branch circuits. To provide protection for the branch circuits, the electrical panel may include a main breaker to control the supply of power from the primary power supply to the branch circuits. To protect the individual branch circuits, the electrical panel may include an individual circuit breaker for each branch circuit. Additionally, within a standard electrical panel, electrical components such as circuit breakers, relays, control circuitry, wiring (such as some low voltage, communication wiring, etc.) or the like can be located.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Disclosed herein is an electrical panel arranged and configured to allow air in and out of the enclosure while controlling water, which may enter the panel. Thus arranged, the electrical panel can operate at cooler temperatures while preserving the water resistance of the design. For example, in some embodiments, incorporating a vent with water management into an outdoor panel allows for greater heat dissipation while achieving NEMA 3R protection.

In some embodiments, an electrical panel is disclosed. The electrical panel including an enclosure, a drip tray, and a channel. The enclosure defining an interior portion to house an electrical component, the enclosure including an opening formed therein for enabling air to enter and exit the enclosure. The drip tray being arranged and configured to receive any water entering through the opening. The channel being adjacent to the drip tray such that any water received by the drip tray is directed to the channel, wherein the channel is arranged and configured to direct the water out of the enclosure.

In some embodiments, the enclosure further includes a top surface and the opening is formed in the top surface.

In some embodiments, the enclosure further includes a liquid guard coupled to and extending from the top surface of the enclosure, the liquid guard being arranged and configured to partially cover the opening formed in the top surface of the enclosure.

In some embodiments, the liquid guard is angled relative to the top surface of the enclosure.

In some embodiments, the liquid guard includes a wire mesh coupled thereto, the wire mesh being arranged and configured to prevent debris from passing through the opening formed in the top surface of the enclosure.

In some embodiments, the liquid guard is coupled to a front edge of the opening, the wire mesh is positioned adjacent a back edge of the opening.

In some embodiments, the drip tray is positioned beneath the opening.

In some embodiments, the drip tray is angled such that gravity directs the water towards the channel.

In some embodiments, the enclosure further comprises a side surface and the channel is arranged and configured to direct the water to the side surface of the enclosure so that the water is directed out of the enclosure.

In some embodiments, the enclosure further includes one or more vertical channels, the one or more vertical channels arranged and configured to receive the water from the channel and to direct the water downward so that the water is directed out of the enclosure.

In some embodiments, the one or more vertical channels include a C-shaped cross-section.

In some embodiments, the enclosure further includes a liquid barrier arranged and configured to inhibit water from entering into the interior portion of the enclosure.

In some embodiments, the liquid barrier extends at least partially into the channel.

In some embodiments, the drip tray and the channel are integrally formed.

An electrical panel is disclosed. In some embodiments, the electrical panel includes an enclosure, a drip tray, and a channel. The enclosure includes a back surface, a front surface, a top surface, a bottom surface, and first and second side surfaces defining an interior portion to house an electrical component, the enclosure including an opening formed in the top surface thereof for enabling air to enter and exit the enclosure. The drip tray is positioned beneath the opening formed in the top surface of the enclosure to receive any water entering through the opening, the drip tray being angled relative to the top surface to direct the water. The channel is positioned adjacent to the drip tray such that any water received by the drip tray is directed to the channel, wherein the channel is arranged and configured to direct the water to at least one of the first and second sides surfaces of the enclosure so that the water is directed out of the enclosure; and/or to one or more vertical channels arranged and configured to direct the water downward so that the water is directed out of the enclosure.

In some embodiments, the enclosure further includes a liquid guard coupled to and extending from the top surface of the enclosure, the liquid guard being arranged and configured to partially cover the opening formed in the top surface of the enclosure.

In some embodiments, the liquid guard is angled relative to the top surface of the enclosure.

In some embodiments, the liquid guard includes a wire mesh coupled thereto, the wire mess being arranged and configured to prevent debris from passing through the opening formed in the top surface of the enclosure.

In some embodiments, the enclosure further includes a liquid barrier arranged and configured to inhibit water from entering through the front surface of the enclosure.

In some embodiments, the liquid barrier extends at least partially into the channel.

BRIEF DESCRIPTION OF THE DRAWINGS

By way of example, a specific embodiment of the disclosed device will now be described, with reference to the accompanying drawings, in which.

Figure 1:
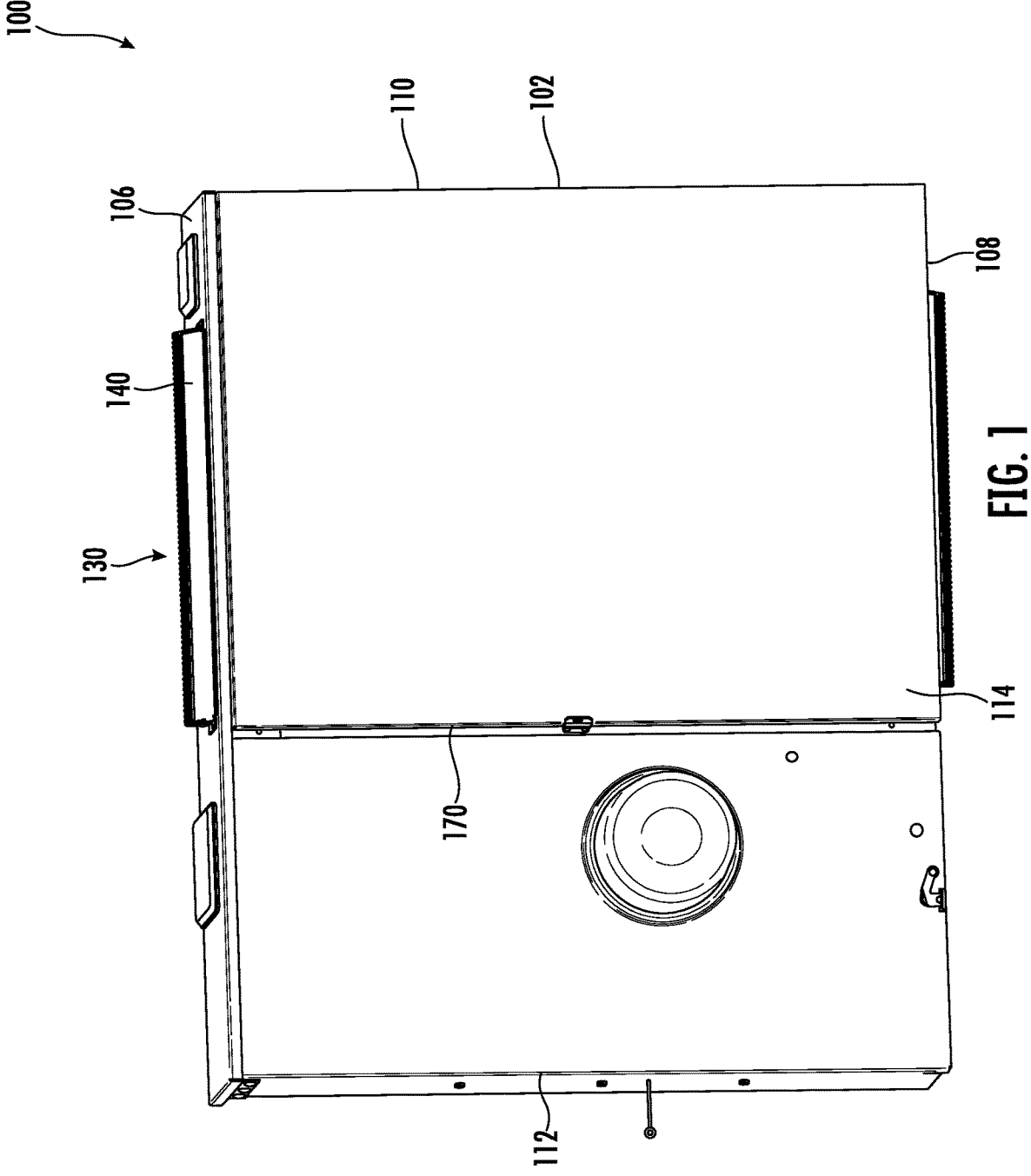
FIG. 1 is a front, perspective view of an example embodiment of an electrical panel according to the present disclosure, the electrical panel including a front door illustrated in a closed position.
Figure 2:
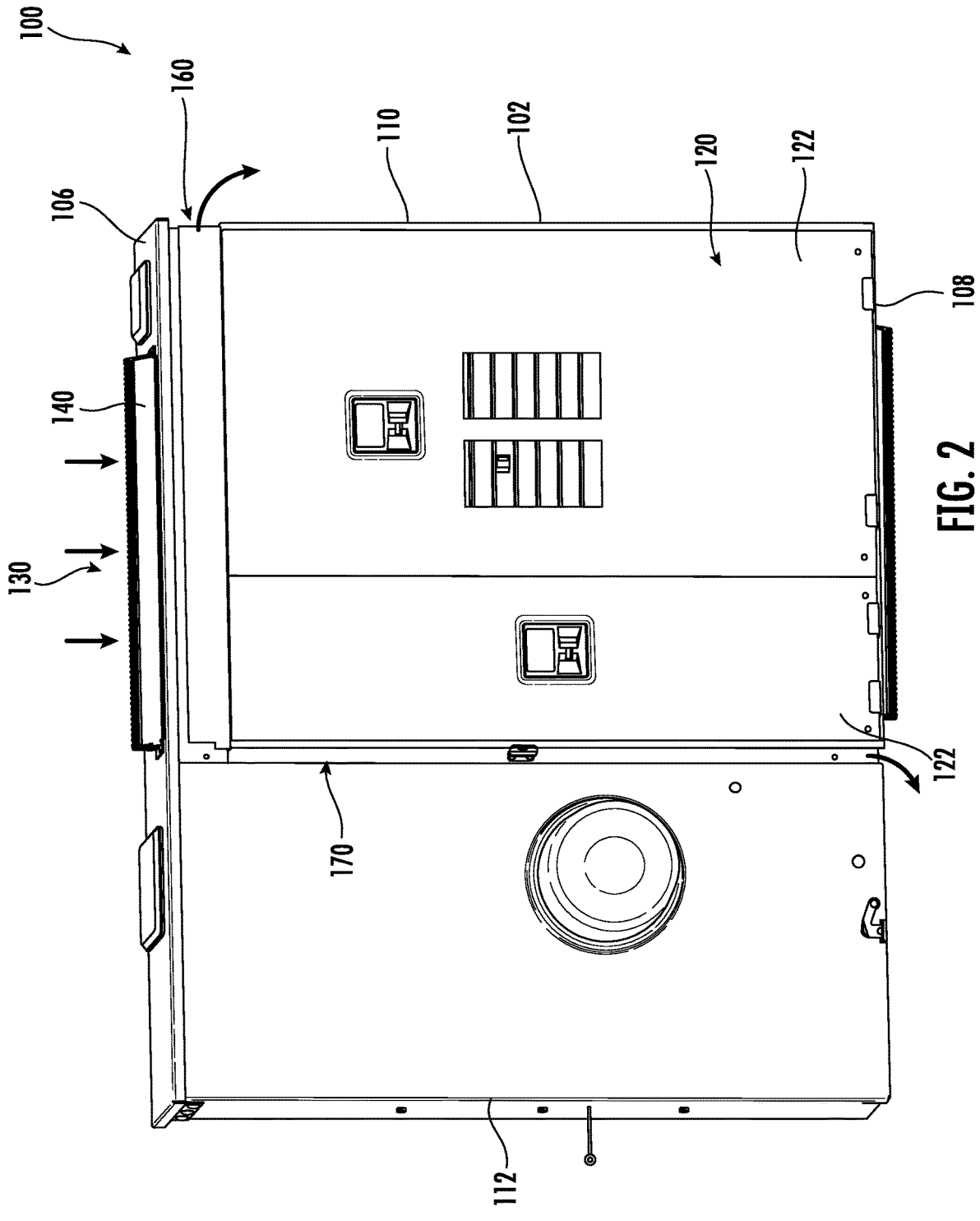
FIG. 2 is a front, perspective view of the electrical panel shown in FIG. 1 with the front door of the electrical panel removed to illustrate an interior panel or dead front.
Figure 3:
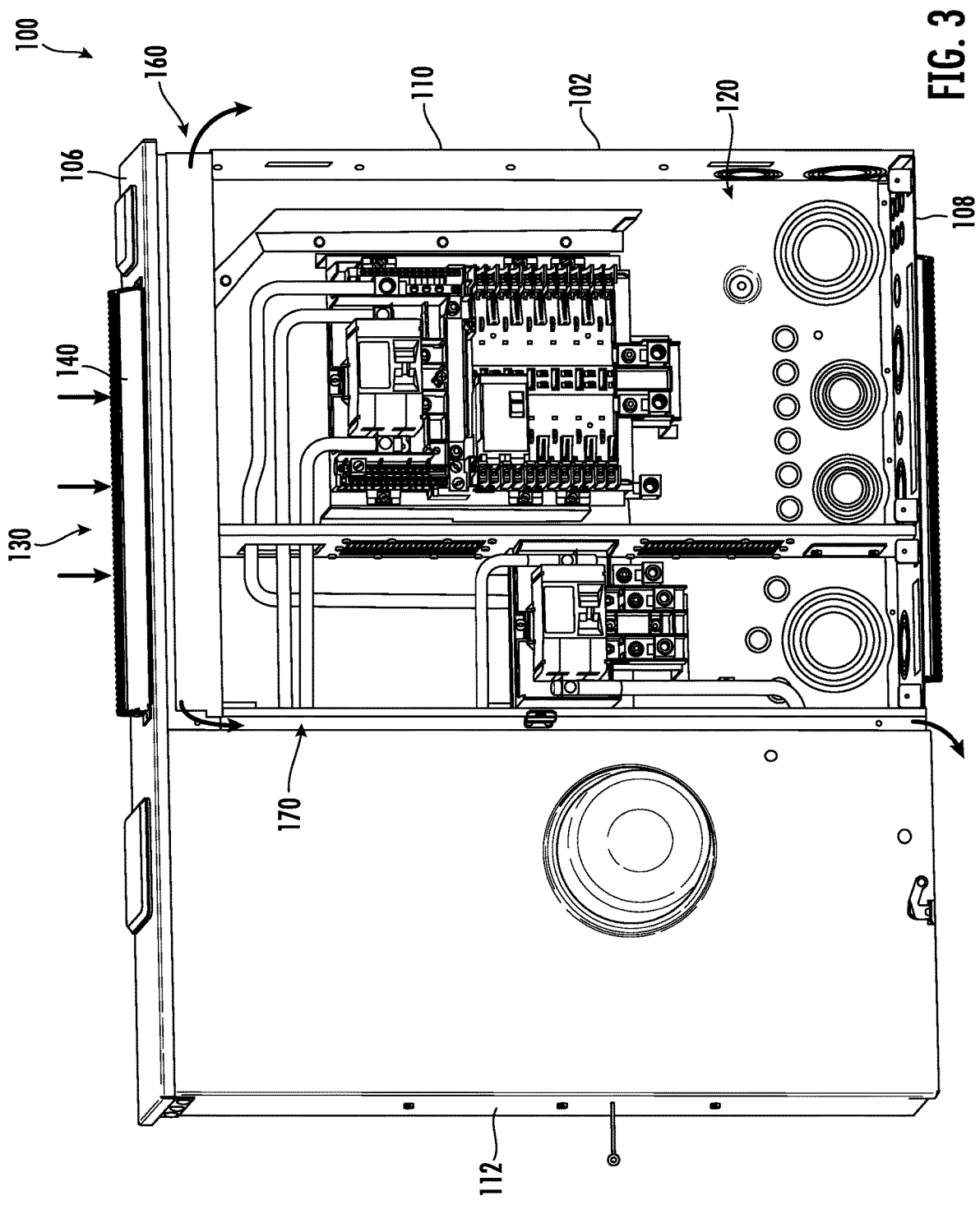
FIG. 3 is a front, perspective view of the electrical panel shown in FIG. 1 with the internal panel or dead front removed.
Figure 4:
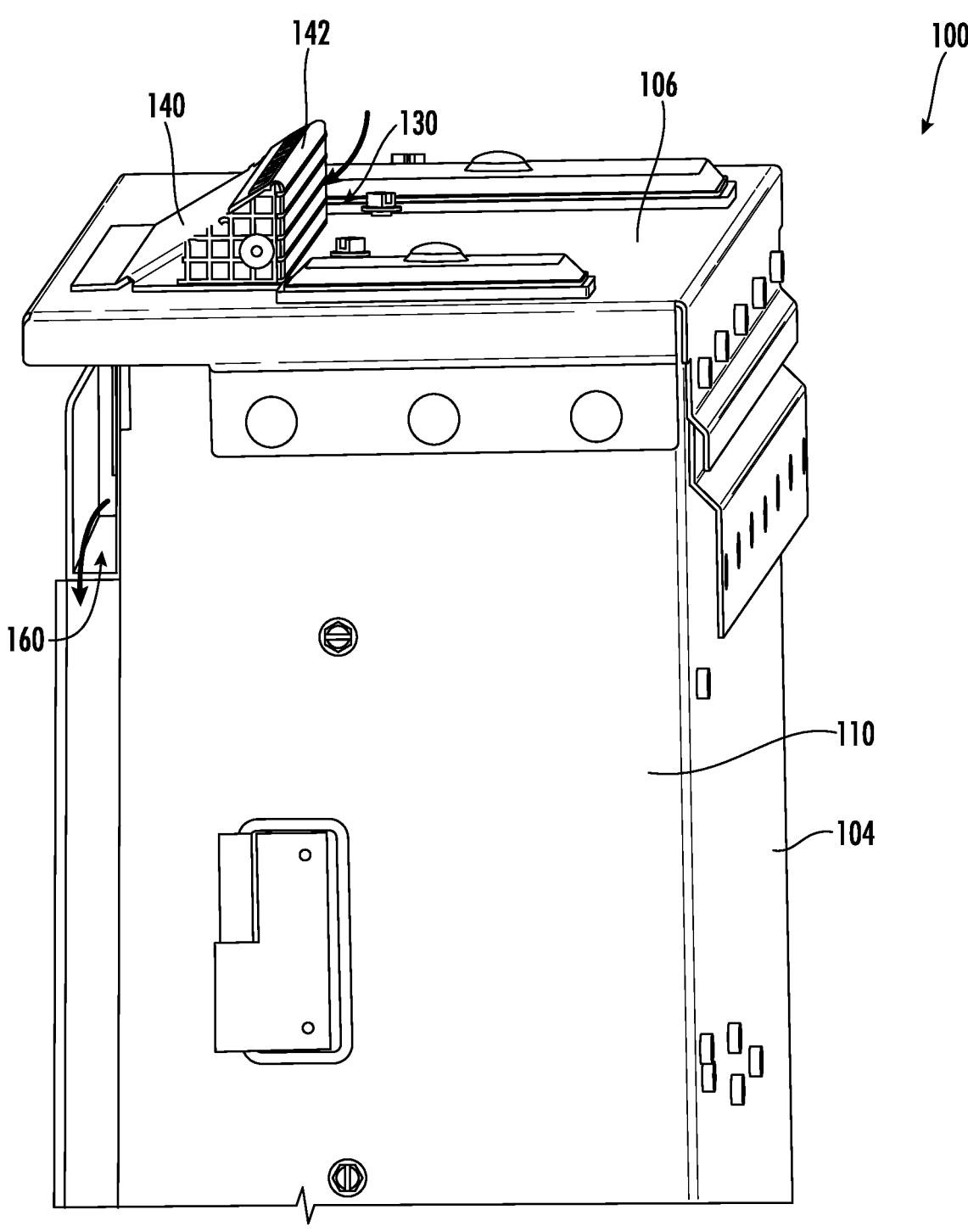
FIG. 4 is a side view of the electrical panel shown in FIG. 1.
Figure 5:
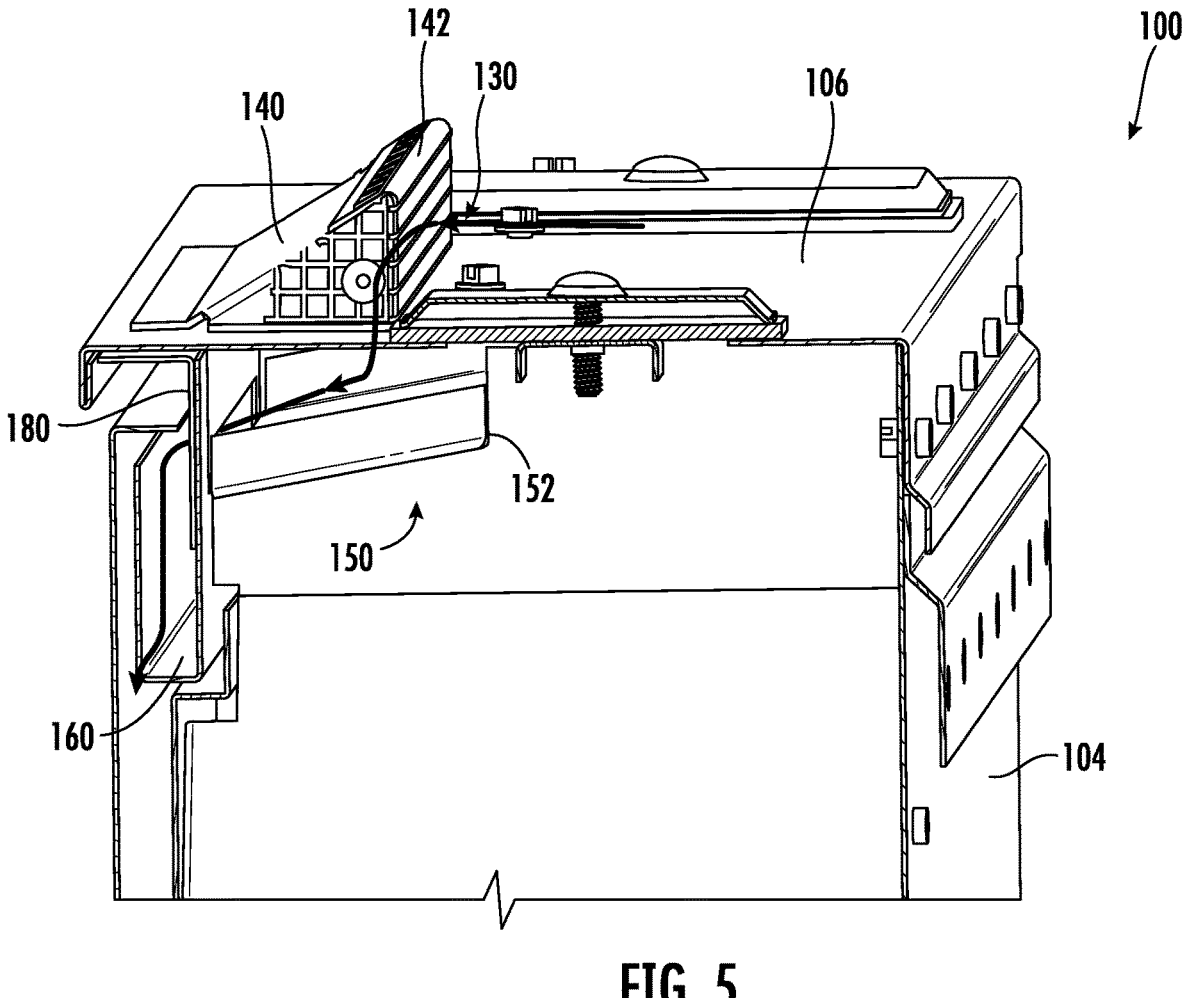
FIG. 5 is a side view of the electrical panel shown in FIG. 1 with the side panel removed.
Figure 6:
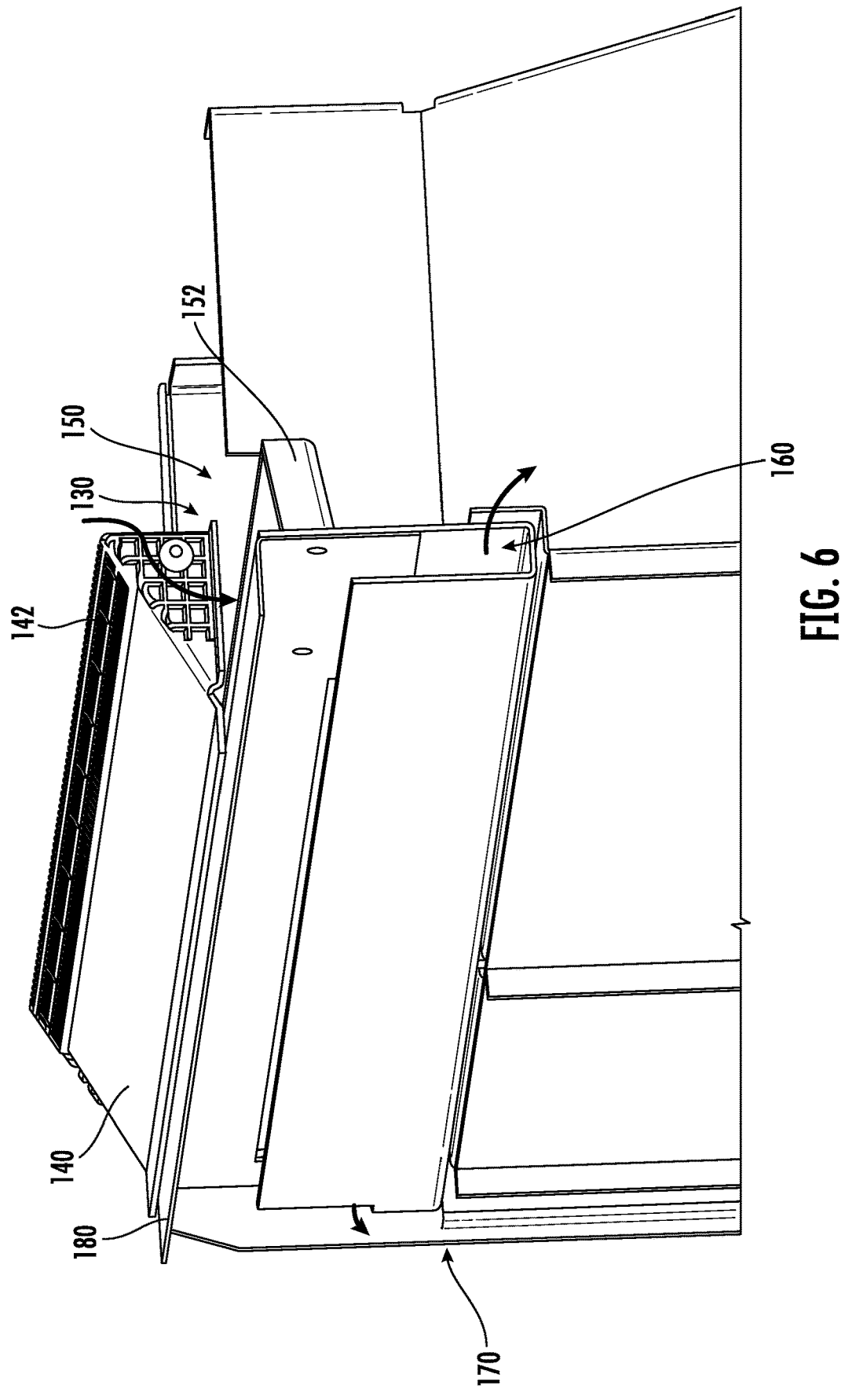
FIG. 6 is a front, perspective view of the electrical panel shown in FIG. 1 with various panels and components removed, FIG. 6 illustrating an embodiment of a drip lip or water directing system in accordance with one or more features of the present disclosure.
Figure 7:
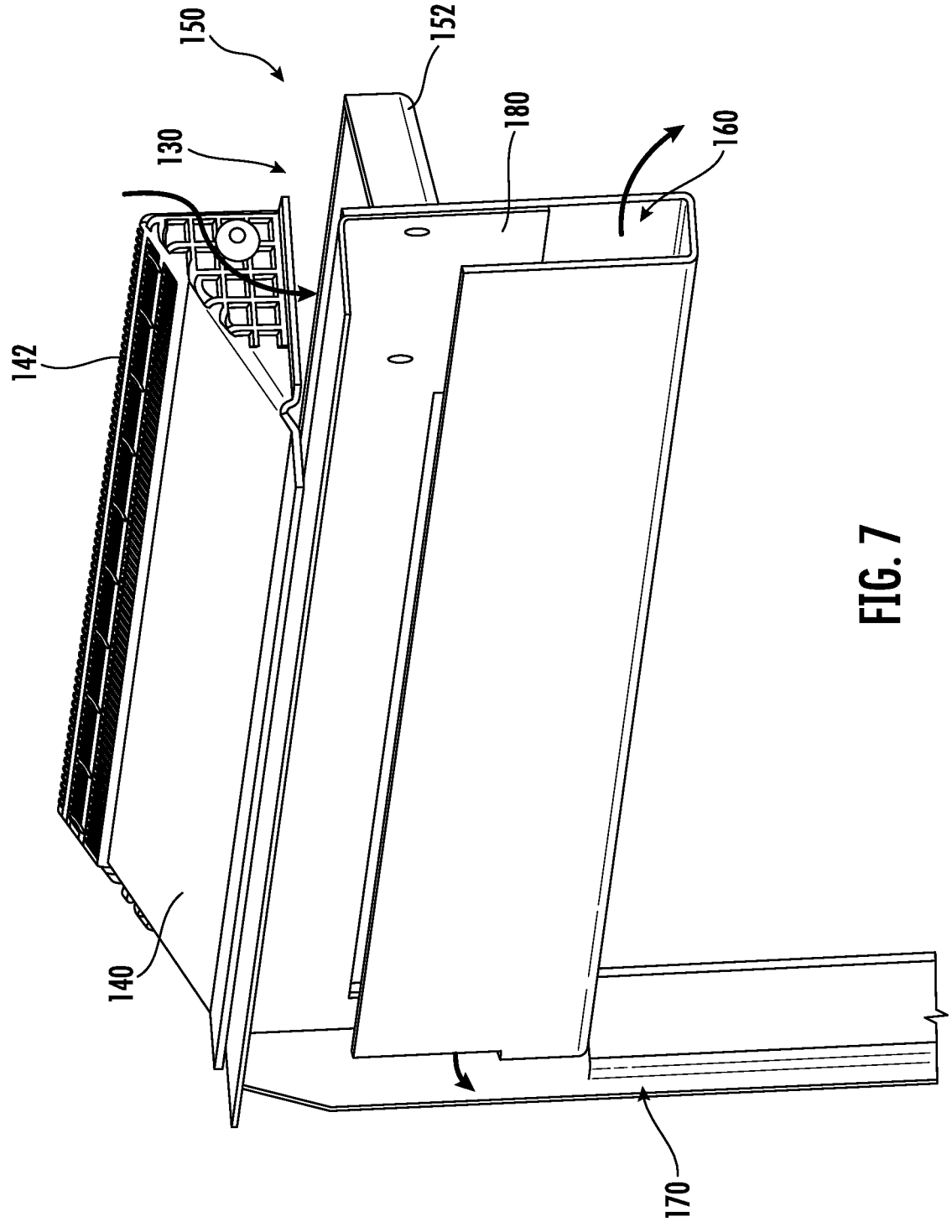
FIG. 7 is a front, perspective view of the drip lip or water directing system shown in FIG. 6.
Figure 8:
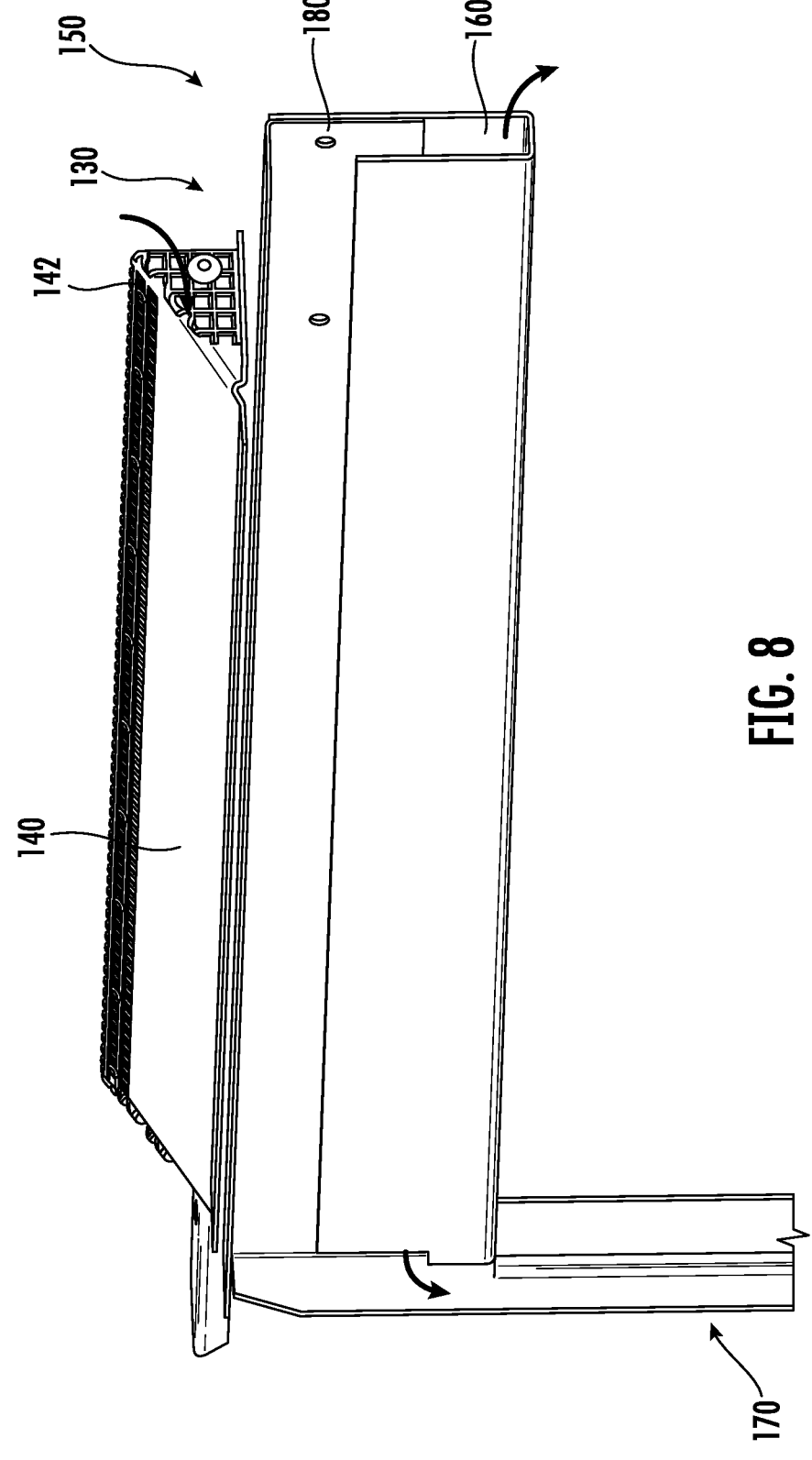
FIG. 8 is an alternate front, perspective view of the drip lip or water directing system shown in FIG. 6.
Figure 9:
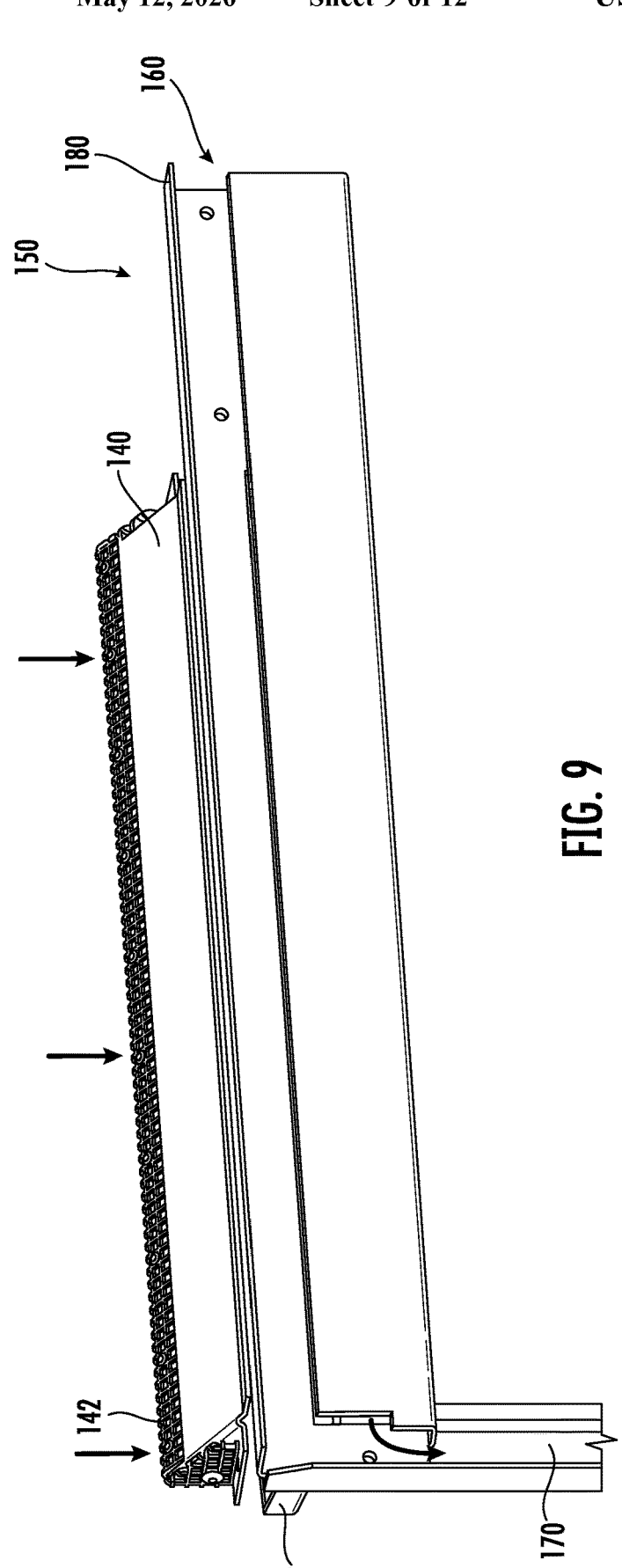
FIG. 9 is an alternate front, perspective view of the drip lip or water directing system shown in FIG. 6.
Figure 10A:
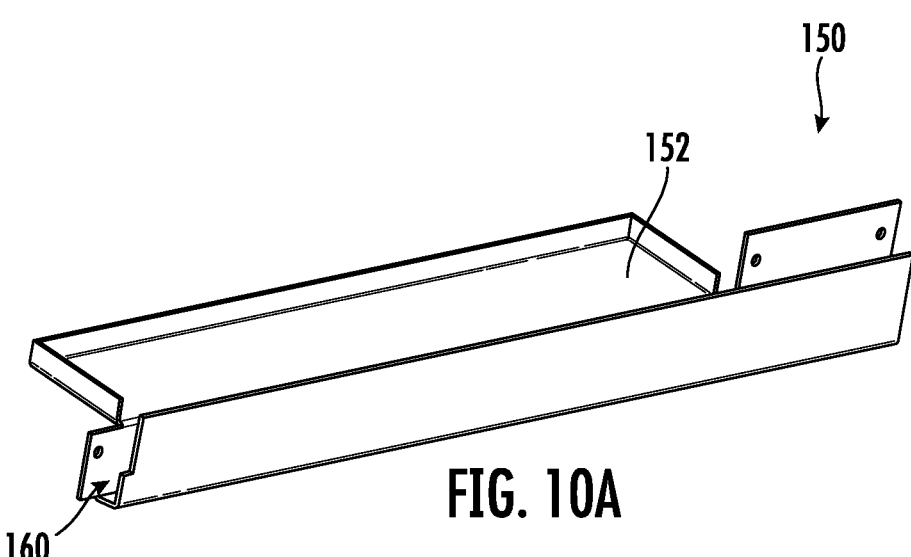
FIG. 10A is a front, perspective view of an embodiment of a drip tray that forms part of the drip lip or water directing system shown in FIG. 6.
Figure 10B:
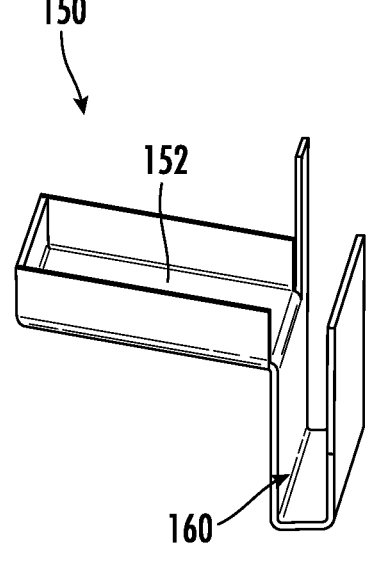
FIG. 10B is a side view of the drip tray shown in FIG. 10A.
Figure 11:
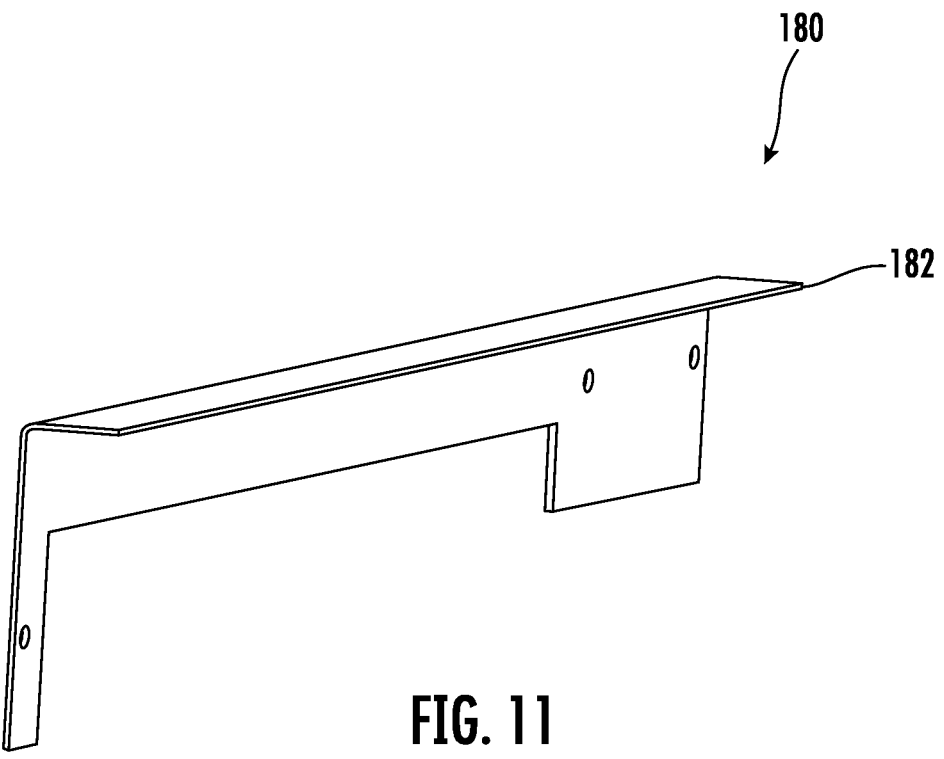
FIG. 11 is a front, perspective view of an embodiment of a liquid barrier that forms part of the drip lip or water directing system shown in FIG. 6.

The drawings are not necessarily to scale. The drawings are merely representations, not intended to portray specific parameters of the disclosure. The drawings are intended to depict example embodiments of the disclosure, and therefore are not to be considered as limiting in scope. In the drawings, like numbers refer to like elements throughout unless otherwise noted.

DETAILED DESCRIPTION

Numerous embodiments of a water management system for use in an electrical panel in accordance with the present disclosure will now be described more fully hereinafter with reference to the accompanying drawings, in which preferred embodiments of the present disclosure are presented. The water management system of the present disclosure may, however, be embodied in many different forms and should not be construed as being limited to the embodiments set forth herein. Rather, these embodiments are provided so that this disclosure will convey certain features of the water management system to those skilled in the art.

As will be described in greater detail below, in various embodiments, the present disclosure is directed to a system and method for managing water such as, for example, moisture, rain, snow, etc. (collectively referred to herein as water or liquid without the intent to limit or distinguish) within an electrical panel such as, for example, a circuit breaker panel, a disconnect panel, or the like (collectively referred to herein as an electrical panel without the intent to limit or distinguish). As will be described herein, in use, the electrical panel includes an enclosure having an opening arranged and configured to permit air to enter and exit the enclosure. In use, the opening allows air to be vented through areas of the electrical panel, which enables the electrical panel to run at cooler temperatures (e.g., dissipate heat) which is beneficial for electrical components contained therein. However, providing an opening in the enclosure, may allow water to enter the enclosure and come into contact with the electrical components. To alleviate these concerns, the present disclosure is directed to a system and method of managing, directing, catching, or the like (terms used interchangeably herein without the intent to limit or distinguish) the water entering through the opening formed in the enclosure. In use, the water management system catches the water entering through the opening and directs the water away from the electrical components and out of the enclosure. As such, the present disclosure provides a system and method allowing the passage of air into and out of the enclosure while simultaneously redirecting any water that may enter the enclosure, safely redirecting the water out of the enclosure of the electrical panel. Thus, the present disclosure provides a system and method of allowing air in and out of the electrical panel while managing the flow of any water that may enter the panel to preserve the water resistance of the enclosure.

In accordance with one or more features of the present disclosure, in some embodiments, the electrical panel may include an enclosure including a vent opening formed in a top surface thereof. The electrical panel may further include a liquid guard and a drip lip or water directing system (also referred to herein as a drip lip water directing system) including a water directing channel. In some embodiments, the electrical panel may further include a liquid barrier. In use, the drip lip or water directing system may be positioned directly under the vent opening formed in the top surface of the enclosure. The drip lip or water directing system includes an angled surface for directing any water which may enter through the opening (e.g., the drip lip or water directing system catches any water entering through the opening formed in the top surface of the enclosure). The drip lip or water directing system directs the water into the water directing channel where it is then directed out of the electrical panel. In some embodiments, the incorporation of the liquid barrier prevents water from being splashed back into the panel.

With reference to the drawings, an exemplary electrical panel 100 according to the present disclosure is shown. In use, as will be described in greater detail herein, the electrical panel 100 may include a water management system to control the movement of water relative to the electrical panel 100.

As illustrated, the electrical panel 100 includes an enclosure 102, which may include a back surface 104, a top surface 106, a bottom surface 108, first and second side surfaces 110, 112, and a front surface 114. In use, the front surface 114 may be adapted and configured as one or more doors. That is, as shown, in one embodiment, the front surface 114 may be pivotably coupled to the enclosure 102 so that an interior portion 120 of the electrical panel 100 may be accessed. The electrical panel 100 may also include one or more interior panels or dead fronts 122 for dividing the enclosure 102 into front and rear portions. In use, the rear portion of the enclosure 102 may house the electrical components and the interior panel or dead front 122 may prevent a user from accidentally contacting or accessing the electrical components.

As illustrated, the top surface 106 may include an opening 130 for venting air (e.g., the opening 130 enables air to enter and exit the enclosure 102 of the electrical panel 100). In the illustrated embodiment, the opening 130 may have a generally rectangular configuration, however this is but one configuration and the opening may have any shape and/or configuration now known or hereafter developed such as, for example, square, circular, oval, etc. and/or the opening may include a plurality of smaller openings in contrast to one single larger opening as illustrated.

In some embodiments, the electrical panel 100 includes a liquid barrier, cover, guard, or the like (referred to herein as a liquid guard 140 without the intent to limit or distinguish). As illustrated, the liquid guard 140 extends from the top surface 106 of the enclosure 102. As illustrated, the liquid guard 140 preferably is angled relative to the top surface 106 of the enclosure 102. In use, the liquid guard 140 is arranged and configured to partially cover the opening 130 to prevent liquid, water, etc. (e.g., rain) from entering therein. In addition, the electrical panel 100 may also include a mesh 142 arranged and configured to prevent debris from passing through the opening 130 such as, for example, leaves, twigs, or the like. In one embodiment, as illustrated, the liquid guard 140 may be arranged and configured to cover the opening 130 along the front surface thereof, while the mesh 142 is arranged and configured along the back and lateral side surfaces thereof, although this is but one configuration and other configurations are envisioned including where one or more components may be eliminated altogether.

In use, the liquid guard 140 may be coupled to the top surface 106 via any suitable mechanism now known or hereafter developed such as, for example, fasteners, welding, or the like. Alternatively, the liquid guard 140 may be integrally formed with the top surface 106 of the enclosure 102. Similarly, the mesh 142 may be coupled to the liquid guard 140 and/or the top surface 106 of the enclosure 102 via any suitable mechanism now known or hereafter developed such as, for example, fasteners, welding, or the like.

In accordance with one or more features of the present disclosure, as illustrated, the electrical panel 100 includes a water directing system or a drip lip 150 (terms used interchangeably herein without the intent to limit or distinguish) including a water directing trough or channel 160 (terms used interchangeably herein without the intent to limit or distinguish). As illustrated, in use, the drip lip 150 is positioned within the enclosure 102 beneath the opening 130 formed in the top surface 106 of the enclosure 102. In use, the drip lip 150 is arranged and configured to collect any water, which may enter the enclosure 102 through the opening 130 and direct the water away from any sensitive electrical component and out of the enclosure 102. For example, as illustrated, in some embodiments, the drip lip 150 includes a drip tray 152 arranged and configured to catch any water entering the enclosure 102 through the opening 130. In some embodiments, the drip tray 152 is angled relative to the top surface 106 of the enclosure 102 to direct the water towards the front surface 114 of the enclosure 102. Thereafter, the drip lip 150 includes a water directing channel 160 formed therein, the water directing channel 160 arranged and configured to receive the water from the drip tray 152 and to direct the water out of the enclosure 102.

In use, the drip lip 150 including the drip tray 152 and the water directing channel 160 may be integrally or monolithically formed. Alternatively, the drip lip 150 including the drip tray 152 and the water directing channel 160 may be separately formed and/or assembly together. In addition, in use, the drip lip 150 including the drip tray 152 and the water directing channel 160 may be coupled to the enclosure 102 in any suitable manner now known or hereafter developed such as, for example, via fasteners, welding, etc.

In some embodiments, the water directing channel 160 is generally level. However, this is but one configuration, and in some embodiments, the water directing channel 160 may be angled towards one side or the other, or the water directing channel may be angled to either side from a centrally located high point. Such angling of the water directing channel 160 may further facilitate directing the water out of the enclosure 102.

Figure 12A:
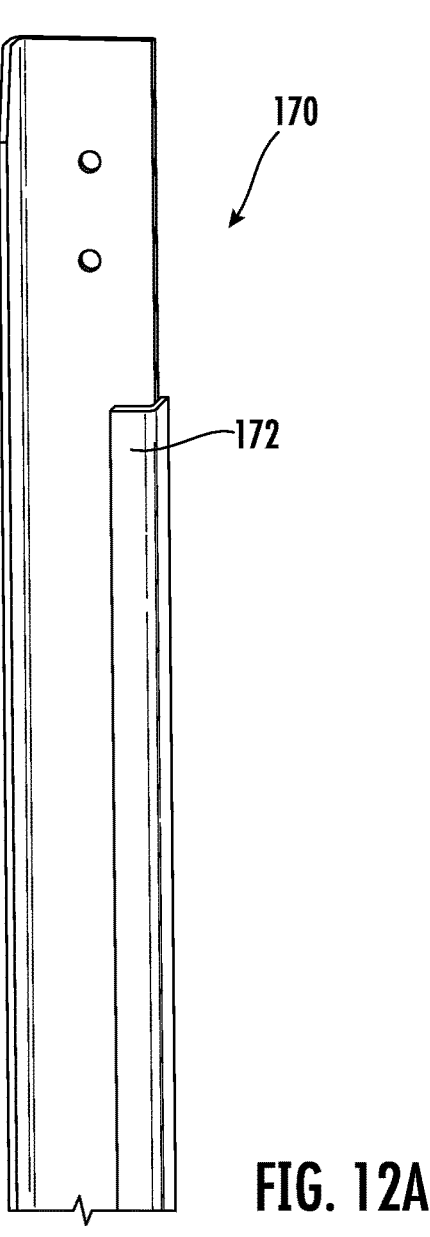
FIG. 12A is a front, perspective view of an embodiment of a vertical channel that forms part of the drip lip or water directing system shown in FIG. 6.
Figure 12B:
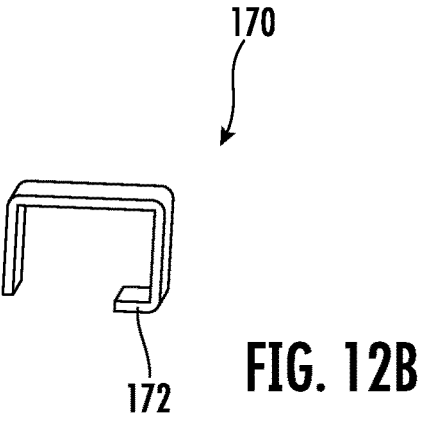
FIG. 12B is a cross-sectional view of the vertical channel shown in FIG. 12A.

In either event, in some embodiments, the water directing channel 160 is arranged and configured to direct the water to one of the first and/or second sides surfaces 110, 112 of the enclosure 102 so that the water is directed away from the electrical components and out of the enclosure 102. For example, in the illustrated embodiment, the water directing channel 160 extends to the first side surface 110 so that the water exits the enclosure 102. In addition, and/or alternatively, where necessary, for example, where a secondary enclosure may be provided as illustrated, the electrical panel 100 may include one or more vertical channels 170 arranged and configured to receive the water from the channel 160 to direct the water out of the enclosure 102. For example, in the illustrated embodiment, the electrical panel 100 may include a vertical channel 170 for receiving any water traveling toward the second side surface 112, the vertical channel 170 directly the water towards the bottom surface 108 of the enclosure 102 where it may exit the enclosure 102. In some embodiments, as best illustrated in FIGS. 12A and 12B, the vertical channel 170 may include a lip or C-shaped configuration 172 for improved water control (e.g., incorporation of a horizontally-extending lip or C-shaped configuration 172 prevents, or at least inhibits, water from exiting the vertical channel 170 until it reaches the bottom of the channel 170).

Thus arranged, as illustrated by the flow of water depicted by arrows in the figures, in use, the drip lip 150 is arranged and configured to catch any water which may enter through the vent opening 130 formed in the top surface 106 of the enclosure 102. The drip lip 150 redirecting the water along a defined pathway, which directs the water away from any electrical components and out of the enclosure 102 (e.g., water is directed along the drip tray 152 into the water directing channel 160 and out of the enclosure 102 either directly or via a vertical or secondary channel 170). Thus, the enclosure 102 may be provided with a vent opening 130 to enable air to enter and exit the enclosure 102 while simultaneously being arranged and configured to receive and redirect any water which may enter through the vent opening 130 out of the enclosure 102 and away from any of the electrical components contained therein.

In addition, and/or alternatively, in some embodiments, the electrical panel 100 may also include a liquid cover, guard, barrier, or the like (referred to herein as a liquid barrier 180 without the intent to limit or distinguish). In use, the liquid barrier 180 is arranged and configured to prevent liquid or water from splashing into the enclosure 102. In use, the liquid barrier 180 is arranged and configured to be coupled to the enclosure 102 and/or the drip lip 150. For example, in the illustrated embodiment, the liquid barrier 180 is coupled to a front surface of the drip lip 150. In use, the liquid barrier 180 may partially extend into the water directing channel 160 of the drip lip 150, and in use, the liquid barrier 180 is arranged and configured to provide additional protection by partially covering the drip lip 150 (e.g., transition from the drip tray 152 to the water directing channel 160) to prevent, or at least inhibit, water from entering through the front surface of the enclosure 102. For example, the liquid barrier 180 is arranged and configured to prevent, or at least inhibit, water from entering from heavy rain, sprinkler systems, or the like, which may direct water at the front surface 114 of the enclosure 102. In some embodiments, the liquid barrier 180 may include a horizontally-extending lip 182 for improved coverage.

It should be appreciated that the illustrated electrical panel 100 is but one example and that the electrical panel may take any form, thus the present disclosure should not be limited to any one electrical panel unless especially claimed.

While the present disclosure makes reference to certain embodiments, numerous modifications, alterations, and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof. The discussion of any embodiment is meant only to be explanatory and is not intended to suggest that the scope of the disclosure, including the claims, is limited to these embodiments. In other words, while illustrative embodiments of the disclosure have been described in detail herein, it is to be understood that the inventive concepts may be otherwise variously embodied and employed, and that the appended claims are intended to be construed to include such variations, except as limited by the prior art.

The foregoing discussion has been presented for purposes of illustration and description and is not intended to limit the disclosure to the form or forms disclosed herein. For example, various features of the disclosure are grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The phrases "at least one," "one or more," and "and/or" as used herein, are open-ended expressions that are both conjunctive and disjunctive in operation. The terms "a" (or "an"), "one or more" and "at least one" can be used interchangeably herein. All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., engaged, attached, coupled, connected, and joined) are to be construed broadly and may include intermediate members between a collection of elements and relative to movement between elements unless otherwise indicated. As such, connection references do not necessarily infer that two elements are directly connected and in fixed relation to each other. All rotational references describe relative movement between the various elements. Identification references (e.g., primary, secondary, first, second, third, fourth, etc.) are not intended to connote importance or priority but are used to distinguish one feature from another. The drawings are for purposes of illustration only and the dimensions, positions, order and relative to sizes reflected in the drawings attached hereto may vary.

What is claimed is:

1. An electrical panel comprising:
   an enclosure defining an interior portion to house an electrical component, the enclosure including an opening formed therein for enabling air to enter and exit the enclosure;
   a drip tray arranged and configured to receive any water entering through the opening; and
   a channel adjacent to the drip tray such that any water received by the drip tray is directed to the channel, wherein the channel is arranged and configured to direct the water out of the enclosure;
   wherein the enclosure further comprises a top surface and the opening is formed in the top surface.

2. The electrical panel of claim 1, further comprising a liquid guard coupled to and extending from the top surface of the enclosure, the liquid guard being arranged and configured to partially cover the opening formed in the top surface of the enclosure.

3. The electrical panel of claim 2, wherein the liquid guard is angled relative to the top surface of the enclosure.

4. The electrical panel of claim 3, wherein the liquid guard includes a wire mesh coupled thereto, the wire mesh being arranged and configured to prevent debris from passing through the opening formed in the top surface of the enclosure.

5. The electrical panel of claim 4, wherein the liquid guard is coupled to a front edge of the opening, the wire mesh is positioned adjacent a back edge of the opening.

6. The electrical panel of claim 1, wherein the drip tray is positioned beneath the opening.

7. The electrical panel of claim 6, wherein the drip tray is angled such that gravity directs the water towards the channel.

8. The electrical panel of claim 7, wherein the enclosure further comprises a side surface; and
   the channel is arranged and configured to direct the water to the side surface of the enclosure so that the water is directed out of the enclosure.

9. The electrical panel of claim 7, further comprising one or more vertical channels, the one or more vertical channels arranged and configured to receive the water from the channel and to direct the water downward so that the water is directed out of the enclosure.

10. The electrical panel of claim 9, wherein the one or more vertical channels include a C-shaped cross-section.

11. An electrical panel comprising:
   an enclosure defining an interior portion to house an electrical component, the enclosure including an opening formed therein for enabling air to enter and exit the enclosure;
   a drip tray arranged and configured to receive any water entering through the opening;
   a channel adjacent to the drip tray such that any water received by the drip tray is directed to the channel, wherein the channel is arranged and configured to direct the water out of the enclosure; and
   a liquid barrier arranged and configured to inhibit water from entering into the interior portion of the enclosure.

12. The electrical panel of claim 11, wherein the liquid barrier extends at least partially into the channel.

13. The electrical panel of claim 1, wherein the drip tray and the channel are integrally formed.

14. An electrical panel comprising:

an enclosure including a back surface, a front surface, a top surface, a bottom surface, and first and second side surfaces defining an interior portion to house an electrical component, the enclosure including an opening formed in the top surface thereof for enabling air to enter and exit the enclosure;

a drip tray positioned beneath the opening formed in the top surface of the enclosure to receive any water entering through the opening, the drip tray being angled relative to the top surface to direct the water; and a channel adjacent to the drip tray such that any water received by the drip tray is directed to the channel, wherein the channel is arranged and configured to direct the water to at least one of the first and second sides surfaces of the enclosure so that the water is directed out of the enclosure.

15. The electrical panel of claim 14, further comprising a liquid guard coupled to and extending from the top surface of the enclosure, the liquid guard being arranged and configured to partially cover the opening formed in the top surface of the enclosure.

16. The electrical panel of claim 15, wherein the liquid guard is angled relative to the top surface of the enclosure.

17. The electrical panel of claim 16, wherein the liquid guard includes a wire mesh coupled thereto, the wire mess being arranged and configured to prevent debris from passing through the opening formed in the top surface of the enclosure.

18. The electrical panel of claim 14, further comprising a liquid barrier arranged and configured to inhibit water from entering through the front surface of the enclosure.

19. The electrical panel of claim 18, wherein the liquid barrier extends at least partially into the channel.

* * * * *